United States Patent
Lv et al.

(10) Patent No.: US 11,887,889 B2
(45) Date of Patent: Jan. 30, 2024

(54) SEMICONDUCTOR DEVICE AND METHOD FOR MANUFACTURING THE SAME

(71) Applicant: Silergy Semiconductor Technology (Hangzhou) LTD, Hangzhou (CN)

(72) Inventors: Zheng Lv, Hangzhou (CN); Xunyi Song, Hangzhou (CN); Meng Wang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 237 days.

(21) Appl. No.: 17/336,539

(22) Filed: Jun. 2, 2021

(65) Prior Publication Data

US 2021/0384073 A1    Dec. 9, 2021

(30) Foreign Application Priority Data

Jun. 8, 2020 (CN) .......................... 202010510070.7

(51) Int. Cl.
  *H01L 21/768*    (2006.01)

(52) U.S. Cl.
  CPC .. *H01L 21/76877* (2013.01); *H01L 21/76831* (2013.01); *H01L 21/76832* (2013.01)

(58) Field of Classification Search
  CPC .............. H01L 23/481; H01L 23/5223; H01L 21/76898; H01L 21/76877; H01L 21/76831; H01L 21/76832
  See application file for complete search history.

(56) References Cited

U.S. PATENT DOCUMENTS

| 5,158,463 | A | 10/1992 | Kim et al. |
| 5,508,542 | A * | 4/1996 | Geiss ................... H10B 12/038 |
| | | | 257/305 |
| 5,933,731 | A | 8/1999 | Tanimoto et al. |
| 7,018,899 | B2 | 3/2006 | Sung |
| 7,074,659 | B2 | 7/2006 | Zuniga et al. |
| 7,230,302 | B2 | 6/2007 | Lotfi et al. |
| 7,372,104 | B2 | 5/2008 | Wu et al. |
| 7,888,222 | B2 | 2/2011 | You et al. |
| 7,981,739 | B1 | 7/2011 | You et al. |
| 7,999,318 | B2 | 8/2011 | Zuniga et al. |
| 8,063,444 | B2 | 11/2011 | Chang |
| 8,085,524 | B2 * | 12/2011 | Roozeboom ........ H01L 27/0805 |
| | | | 361/301.2 |
| 8,119,507 | B2 | 2/2012 | You |

(Continued)

FOREIGN PATENT DOCUMENTS

TW    I523233 B    2/2016

*Primary Examiner* — Jaehwan Oh
*Assistant Examiner* — John M Parker

(57) ABSTRACT

A method of manufacturing a semiconductor device can include: forming an interlayer dielectric layer on an upper surface of a lower metal layer, the lower metal layer including first and second regions; forming a through hole extending from an upper surface of interlayer dielectric layer to the lower metal layer to expose the upper surface of the lower metal layer; forming a conductive layer covering a bottom part and sidewall parts of the through hole, and the upper surface of the interlayer dielectric layer; forming a first dielectric layer covering the first conductive layer on the first region of the lower metal layer; filling the through hole with a first metal; and forming an upper metal layer above the upper surface of the interlayer dielectric layer.

16 Claims, 3 Drawing Sheets

(56) References Cited

U.S. PATENT DOCUMENTS

| | | |
|---|---|---|
| 8,293,612 B2 | 10/2012 | Lee |
| 8,319,283 B2 | 11/2012 | Min et al. |
| 8,431,450 B1 | 4/2013 | Zuniga et al. |
| 8,455,340 B2 | 6/2013 | Zuniga et al. |
| 8,574,973 B1 | 11/2013 | You et al. |
| 8,581,344 B2 | 11/2013 | Liu |
| 8,716,790 B2 | 5/2014 | Lotfi et al. |
| 8,716,795 B2 | 5/2014 | You |
| 8,912,600 B2 | 12/2014 | You |
| 10,262,997 B2 | 4/2019 | Lin et al. |
| 2005/0073007 A1 | 4/2005 | Chen et al. |
| 2006/0006462 A1 | 1/2006 | Chang et al. |
| 2010/0052052 A1 | 3/2010 | Lotfi et al. |
| 2013/0069199 A1* | 3/2013 | Adkisson ............... H01L 28/90 257/532 |
| 2013/0200453 A1 | 8/2013 | Park |
| 2014/0001549 A1 | 1/2014 | Bode et al. |
| 2014/0320174 A1 | 10/2014 | Lu et al. |
| 2015/0028450 A1* | 1/2015 | Park ............... H01L 21/76898 257/532 |
| 2015/0235944 A1* | 8/2015 | Filippi ............. H01L 23/53238 257/532 |
| 2017/0104056 A1* | 4/2017 | See .................... H01L 21/0217 |
| 2017/0179279 A1 | 6/2017 | Lin et al. |
| 2018/0174887 A1 | 6/2018 | Chuang |
| 2019/0051596 A1* | 2/2019 | Suo .................... H01L 21/283 |
| 2019/0081045 A1 | 3/2019 | Lin et al. |
| 2020/0135845 A1* | 4/2020 | Seidel .................. H01L 28/75 |

* cited by examiner

SEMICONDUCTOR DEVICE AND METHOD FOR MANUFACTURING THE SAME

RELATED APPLICATIONS

This application claims the benefit of Chinese Patent Application No. 202010510070.7, filed on Jun. 8, 2020, which is incorporated herein by reference in its entirety.

FIELD OF THE INVENTION

The present invention generally relates to the field of semiconductor technology, and more particularly to semiconductor devices and methods for making semiconductor devices.

BACKGROUND

With the improvement of the integration of semiconductor devices, the requirements for capacitors are becoming increasingly a high-capacitance density, particularly in radio frequency (RF) and analog/mixed signal (AMS) integrated circuit devices. In some approaches, high dielectric constant metal-insulator-metal (MIM) capacitors have been extensively utilized.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
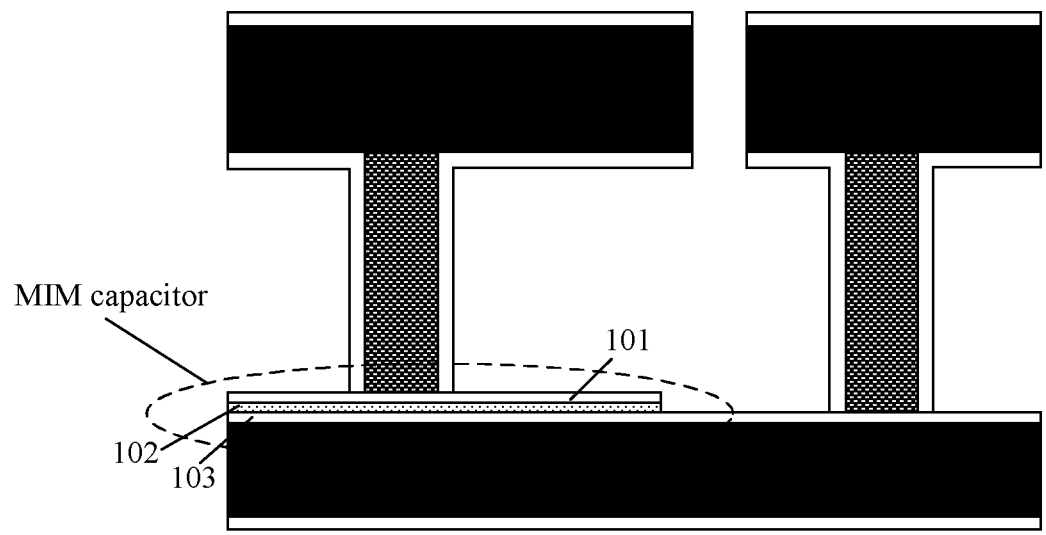
FIG. 1 is a sectional view of an example semiconductor device.

Typically, in back end of the line (BEOL) processes, a metal-insulator-metal (MIM) capacitor with an upper, middle and lower sandwich structure is formed when an aluminum interconnect structure is formed. As shown in FIG. 1, upper plate 101 and lower plate 103 of the MIM capacitor are adjacent aluminum metal layers in the aluminum interconnection structure. The material of dielectric layer 102 of the MIM capacitor can be a high dielectric constant such as SiON, SiN, $Al_2O_3$, or $HfO_2$. However, under the condition that the dielectric layer remains unchanged, changing the MIM capacitor structure can greatly improve the capacitance density, in order to meet the needs of higher capacitance density.

In particular embodiments, a method of manufacturing a semiconductor device can include: forming an interlayer dielectric layer on an upper surface of a lower metal layer, the lower metal layer including first and second regions; forming a through hole extending from an upper surface of interlayer dielectric layer to the lower metal layer to expose the upper surface of the lower metal layer; forming a conductive layer covering a bottom part and sidewall parts of the through hole, and the upper surface of the interlayer dielectric layer; forming a first dielectric layer covering the first conductive layer on the first region of the lower metal layer; filling the through hole with a first metal; and forming an upper metal layer above the upper surface of the interlayer dielectric layer. Also, above the first region of the lower metal layer, the upper metal layer is in contact with the first metal and the first dielectric layer.

Figure 2A:
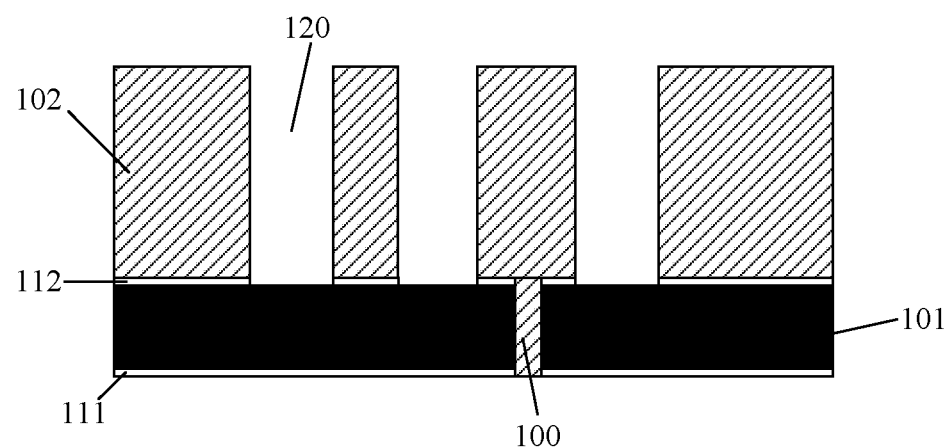
FIGS. 2A-2E are sectional views of some stages of an example method of manufacturing a semiconductor device, in accordance with embodiments of the present invention.

Referring now to FIGS. 2A-2E, shown are sectional views of some stages of an example method of manufacturing a semiconductor device, in accordance with embodiments of the present invention. As shown in FIG. 2A, interlayer dielectric layer 102 can be formed on an upper surface of lower metal layer 101, and through hole 120 extending from an upper surface of interlayer dielectric layer 102 to lower metal layer 101 may be formed in interlayer dielectric layer 102. Through hole 120 can expose the upper surface of lower metal layer 101. For example, through hole 120 may be formed by an etching process. For example, interlayer dielectric layer 102 can be etched from the upper surface of interlayer dielectric layer 102 until the upper surface of lower metal layer 101 is exposed. In this embodiment, through hole 120 may include multiple holes 120 (e.g., at least two holes).

Before the step of forming interlayer dielectric layer 102, conductive layer 112 can be formed on the upper surface of lower metal layer 101. When interlayer dielectric layer 102 is etched, part of conductive layer 112 may also be etched until the through hole 120 exposes the upper surface of lower metal layer 101. Conductive layer 112 can be used as an adhesive layer between lower metal layer 101 and interlayer dielectric layer 102. For example, lower metal layer 101 can include a first region and a second region. The method can also include forming insulation layer 100 between the first region and the second region of lower metal layer 101, such that the first region is isolated from the second region by insulation layer 100.

It should be noted that lower metal layer 101 may be located on a semiconductor substrate. For example, lower metal layer 101 can be located on a contact region of the semiconductor substrate. Lower metal layer 101 may also be located on a lower metal interconnection structure. For example, lower metal layer 101 may be located on the metal via of the lower metal interconnection structure. In another example, lower metal layer 101 can be located on interlayer dielectric layer of the lower layer. In this embodiment, lower metal layer 101 may be formed by deposition process. Before the step of forming lower metal layer 101, the method can also include forming conductive layer 111 on the semiconductor substrate or on the metal via (or the interlayer dielectric layer) of the lower metal interconnection structure. Conductive layer 111 may serve as an adhesive layer in order to prevent problems (e.g., cracks) between the lower metal layer and the interlayer dielectric layer. In this embodiment, conductive layers 111 and 112 can be configured as Ti/TiN. For example, lower metal layer 101 may be configured as Al material, and the interlayer dielectric layer can include oxide.

Figure 2B:
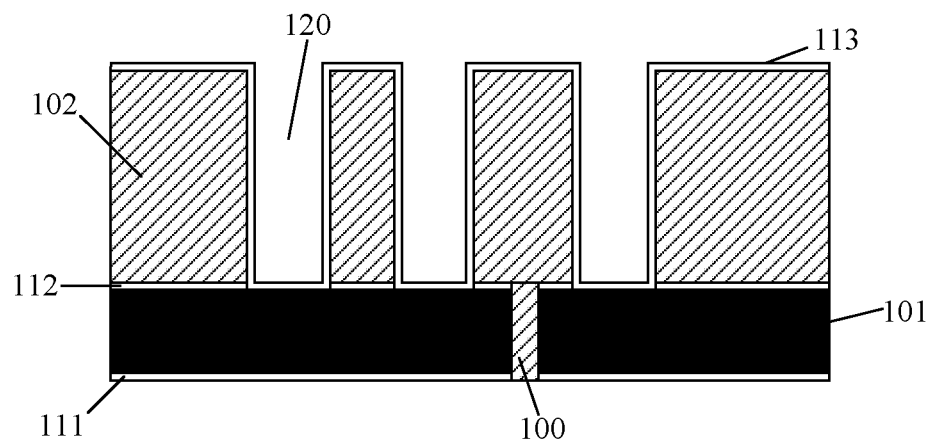

As shown in FIG. 2B, conductive layer 113 may be formed to cover a bottom part and sidewall parts of through hole 120, and the upper surface of interlayer dielectric layer 102. Optionally, conductive layer 113 on the bottom part of through hole 120 may also be etched away. In this embodiment, conductive layer 113 can be provided as Ti/TiN. Conductive layer 113 may not only serve as an electrode of the capacitor structure, but also as an adhesive layer between interlayer dielectric layer 102 and a first metal formed in a subsequent process.

Figure 2C:
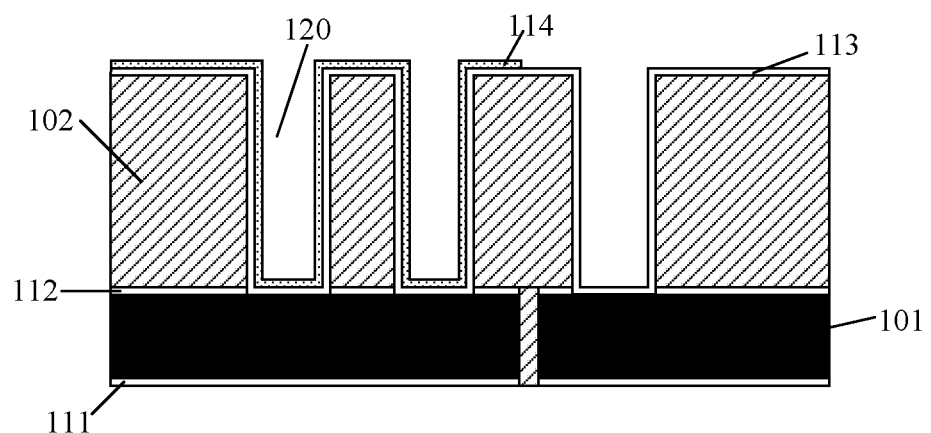

As shown in FIG. 2C, dielectric layer 114 covering conductive layer 113 on the first region of the lower metal layer may be formed. For example, a dielectric layer 114 covering conductive layer 113 can be formed, and then dielectric layer 114 in the second region of the lower metal layer may be removed by etching process, such that conductive layer 113 in the second region is exposed. For example, dielectric layer 114 is a dielectric material with a high dielectric constant (e.g., SiON, SiN, $Al_2O_3$, $HfO_2$, etc.).

Figure 2D:
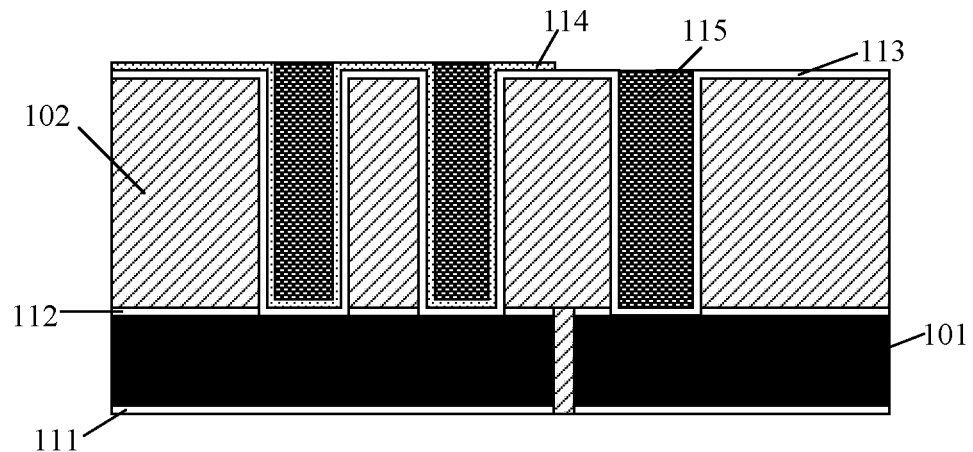

As shown in FIG. 2D, metal 115 can be used to fill through hole 120. For example, metal 115 may be deposited in through hole 120, and then metal 115 can be flush with dielectric layer 114 on the first region of the lower metal layer by a planarization process (e.g., etching back metal 115). Above the second region of the lower metal layer, metal 115 may be flush with conductive layer 113. For example, metal 115 can include a tungsten material.

Figure 2E:
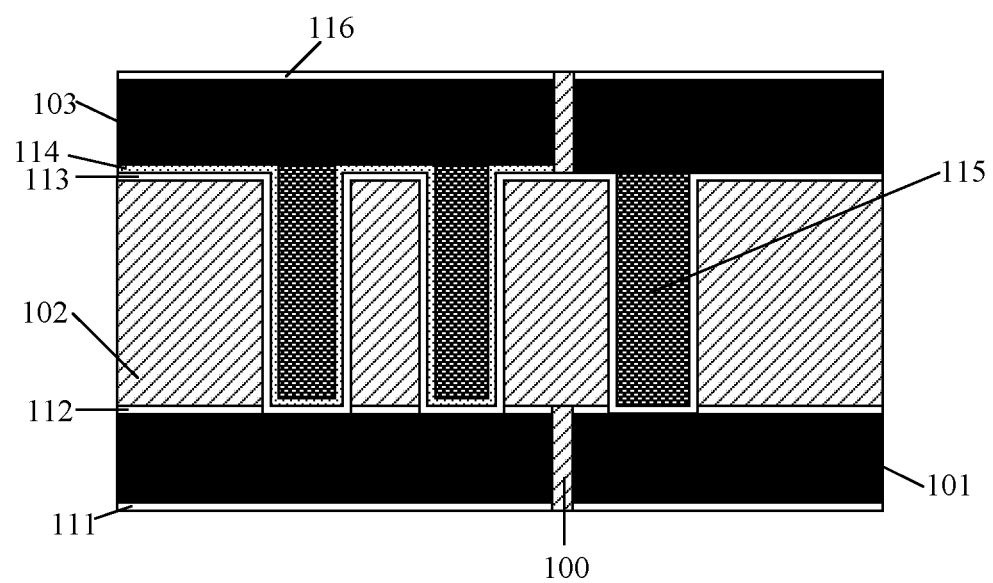

As shown in FIG. 2E, upper metal layer 103 may be formed on the upper surface of the structure shown in FIG. 2D. For example, upper metal layer 103 can be formed on metal 115, dielectric layer 114, and conductive layer 113. For example, upper metal layer 103 can be made of Al material. On the first region of the lower metal layer, upper metal layer 103 can be in contact with metal 115 and dielectric layer 114. Above the second region of the lower metal layer, upper metal layer 103 may be in contact with metal 115 and conductive layer 113. In another example, conductive layer 116 (e.g., Ti/TiN) can be formed on upper metal layer 103.

The semiconductor device formed in this example can include a capacitor structure located on the first region of the lower metal layer. For example, an upper electrode of the capacitor structure can include upper metal layer 103 and metal 115, the dielectric of the capacitor structure can be dielectric layer 114, and a lower electrode of the capacitor structure can include lower metal layer 101 and conductive layer 113. The capacitor structure may be located between the semiconductor substrate and the metal layer of the first-level metal interconnection structure. Of course, the capacitor structure may also be located between the metal layers of the two-level metal interconnection structure in some cases.

Particular embodiments may also provide a semiconductor device. As shown in FIG. 2E, the semiconductor device can include lower metal layer 101, interlayer dielectric 102 with through holes, conductive layer 113, dielectric layer 114, metal 115, and upper metal layer 103. For example, lower metal layer 101 can include a first region and a second region, and interlayer dielectric layer 102 may be located on the upper surface of lower metal layer 101. The through hole can extend from the upper surface of interlayer dielectric layer 102 to lower metal layer 101, and may expose the upper surface of lower metal layer 101. Conductive layer 113 can cover a bottom part and sidewall parts of the through hole, and the upper surface of interlayer dielectric layer 102. Dielectric layer 114 can cover conductive layer 113 on the first region of the lower metal layer. Metal 115 may fill the through holes, and upper metal layer 103 can be located above the upper surface of interlayer dielectric layer 102. For example, above the first region of the lower metal layer, upper metal layer 103 may be in contact with metal 115 and dielectric layer 114. Above the second region of the lower metal layer, upper metal layer 103 can be in contact with metal 115 and conductive layer 113.

The semiconductor device can also include conductive layer 112 located between lower metal layer 101 and interlayer dielectric layer 102, in order to serve as an adhesive layer between lower metal layer 101 and interlayer dielectric layer 102. For example, upper metal layer 103 and lower metal layer 101 can include aluminum materials. Dielectric layer 102 is set can be a dielectric with a high dielectric constant, such as SiON, SiN, $Al_2O_3$, $HfO_2$, or the like.

The semiconductor device can include a capacitor structure, where an upper electrode of the capacitor structure can include upper metal layer 103 and metal 115, the dielectric of the capacitor structure can be dielectric layer 114, and a lower electrode of the capacitor structure can include lower metal layer 101 and conductive layer 113. In this embodiment, the capacitor structure may be located between the semiconductor substrate and the metal layer of the first-level metal interconnection structure; that is, lower metal layer 101 is located on the semiconductor substrate. For example, lower metal layer 101 can be located on a contact area of the semiconductor substrate.

Of course, in other embodiments, the capacitor structure can be located between the metal layers of the two-layer metal interconnection structure. That is, lower metal layer 101 can be located on the metal via of the lower metal interconnection structure, and may also be located on the interlayer dielectric layer of lower layer. In addition, the semiconductor device can also include conductive layer 111 located on the lower surface of lower metal layer 101. For example, conductive layer 111 can be located between lower metal layer 101 and the semiconductor substrate, or between the lower metal layer and the metal via of the lower metal interconnection structure. Further, the semiconductor device can also include conductive layer 116 on the upper surface of upper metal layer 103. For example, conductive layers 111, 112, 113, and 116 can include Ti or TiN, metal can include tungsten, the interlayer dielectric layer can include oxide.

In this embodiment, the semiconductor device can also include insulation layer 100 located between the first region and the second region of the lower metal layer, in order to isolate the first region and the second region. The semiconductor device can also include an insulation layer located between a first region and a second region of the upper metal layer corresponding the first region and the second region of the lower metal layer.

In this way, particular embodiments may provide a semiconductor device with a capacitor structure that is formed by forming a first conductive layer, a first dielectric layer and a first metal in a through hole, and uses the vertical structure of the through hole, in order to improve the capacitance density.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A semiconductor device, comprising:
   a) a lower metal layer having a first region and a second region that are isolated from each other;
   b) an interlayer dielectric layer located on an upper surface of the lower metal layer;
   c) a through hole extending from an upper surface of the interlayer dielectric layer to the lower metal layer to expose the upper surface of the lower metal layer;
   d) a first conductive layer covering a bottom part and sidewall parts of the through hole, and the upper surface of the interlayer dielectric layer;
   e) a first dielectric layer covering the first conductive layer above the first region of the lower metal layer;
   f) a first metal filling the through hole; and
   g) an upper metal layer located above the upper surface of the interlayer dielectric layer, wherein above the first region of the lower metal layer, the upper metal layer is in contact with the first metal and the first dielectric layer.

2. The semiconductor device of claim 1, wherein a capacitor structure is formed having an upper electrode comprising the upper metal layer and the first metal, a dielectric comprising the first dielectric layer, and a lower electrode comprising the lower metal layer and the first conductive layer.

3. The semiconductor device of claim 1, wherein above the second region of the lower metal layer, the upper metal layer is in contact with the first metal and the first conductive layer.

4. The semiconductor device of claim 1, further comprising a second conductive layer located between the lower metal layer and the interlayer dielectric layer.

5. The semiconductor device of claim 4, wherein each of the first conductive layer and the second conductive layer comprises a material selected from a group consisting of: Ti and TiN.

6. The semiconductor device of claim 1, further comprising an insulation layer located between the first region of the lower metal layer and the second region of the lower metal layer.

7. The semiconductor device of claim 1, further comprising a third conductive layer located on the upper metal layer.

8. The semiconductor device of claim 1, wherein the lower metal layer is located on a semiconductor substrate.

9. The semiconductor device of claim 8, further comprising a fourth conductive layer located between the lower metal layer and the semiconductor substrate.

10. The semiconductor device of claim 8, further comprising a fourth conductive layer located between the lower metal layer and a metal via of a lower metal interconnection structure.

11. The semiconductor device of claim 1, wherein the lower metal layer is located on a metal via of a lower metal interconnection structure.

12. The semiconductor device of claim 1, wherein each of the upper metal layer and the lower metal layer comprises aluminum.

13. The semiconductor device of claim 1, wherein the first dielectric layer is a dielectric having a high dielectric constant.

14. The semiconductor device of claim 1, wherein the first dielectric layer comprises a material selected from a group consisting of: SiON, SiN, $Al_2O_3$, and $HfO_2$.

15. The semiconductor device of claim 1, wherein the first metal comprises tungsten.

16. The semiconductor device of claim 1, wherein the interlayer dielectric layer comprises oxide.

* * * * *